(12) United States Patent
Takeuchi et al.

(10) Patent No.: US 10,727,357 B2
(45) Date of Patent: Jul. 28, 2020

(54) PHOTOVOLTAIC POWER GENERATION SYSTEM INSPECTION APPARATUS AND INSPECTION METHOD

(71) Applicant: OMRON Corporation, Kyoto-shi, Kyoto (JP)

(72) Inventors: Tsuyoshi Takeuchi, Aso (JP); Akihiko Sano, Uji (JP); Kohei Tomita, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 263 days.

(21) Appl. No.: 15/786,732

(22) Filed: Oct. 18, 2017

(65) Prior Publication Data
US 2018/0166589 A1 Jun. 14, 2018

(30) Foreign Application Priority Data
Dec. 14, 2016 (JP) .................................. 2016-241910

(51) Int. Cl.
| | |
|---|---|
| *G01R 31/26* | (2020.01) |
| *G01R 31/40* | (2020.01) |
| *H01L 31/02* | (2006.01) |
| *H01L 31/0443* | (2014.01) |
| *H02S 50/10* | (2014.01) |
| *H02S 50/00* | (2014.01) |

(52) U.S. Cl.
CPC .... *H01L 31/02021* (2013.01); *H01L 31/0443* (2014.12); *H02S 50/00* (2013.01); *H02S 50/10* (2014.12)

(58) Field of Classification Search
CPC ........ G01R 31/02; G01R 31/26; G01R 31/28; H01L 31/042; H01L 31/0443; H01L 31/02021; H02S 50/00; H02S 50/10
See application file for complete search history.

(56) References Cited

U.S. PATENT DOCUMENTS

| | | |
|---|---|---|
| 2012/0286961 A1 | 11/2012 | Komano et al. |
| 2013/0009662 A1* | 1/2013 | Komano ................. H02S 50/10 324/761.01 |
| 2014/0062500 A1 | 3/2014 | Behrends et al. |
| 2014/0117999 A1 | 5/2014 | Shigemura et al. |
| 2015/0054523 A1 | 2/2015 | Perkinson |

(Continued)

FOREIGN PATENT DOCUMENTS

| | | |
|---|---|---|
| CN | 103475271 A | 12/2013 |
| JP | 2008-91828 A | 4/2008 |
| JP | 2009-21341 A | 1/2009 |

(Continued)

OTHER PUBLICATIONS

WO 2016/072243 Translation.*

(Continued)

*Primary Examiner* — Minh N Tang
(74) *Attorney, Agent, or Firm* — Metrolex IP Law Group, PLLC

(57) ABSTRACT

A defect number determination unit determines whether or not a solar cell string is defective in a plurality of positions on the basis of whether or not a combined impedance found from impedances in the case where an inspection signal is applied to a P terminal and an N terminal of the solar cell string deviates from a reference impedance by greater than or equal to a predetermined threshold.

9 Claims, 7 Drawing Sheets

(56) References Cited

U.S. PATENT DOCUMENTS

2017/0214362 A1* 7/2017 Basu ...................... G01R 31/08

FOREIGN PATENT DOCUMENTS

| JP | 2012-238716 A | 12/2012 | | |
|----|---------------|---------|---|---|
| JP | 2012-256771 A | 12/2012 | | |
| JP | 2013-156125 A | 8/2013 | | |
| JP | 2013-214631 A | 10/2013 | | |
| JP | 2014-186022 A | 10/2014 | | |
| JP | 2016-93039 A | 5/2016 | | |
| JP | 2016-171671 A | 9/2016 | | |
| WO | 2016008497 A1 | 1/2016 | | |
| WO | WO-2016072243 A1 * | 5/2016 | ............. | G01R 31/02 |

OTHER PUBLICATIONS

EESR dated Jan. 17, 2018 in a counterpart European Patent application.

Japanese Office Action ("JPOA") dated Feb. 4, 2020 in a counterpart Japanese Patent application.

* cited by examiner

PHOTOVOLTAIC POWER GENERATION SYSTEM INSPECTION APPARATUS AND INSPECTION METHOD

CROSS-REFERENCES TO RELATED APPLICATIONS

This application claims priority to Japanese Patent Application No. 2016-241910 filed Dec. 14, 2016, the entire contents of which are incorporated herein by reference.

FIELD

The disclosure relates to techniques for inspecting a photovoltaic power generation system, and relates to inspection techniques for determining whether or not defective locations are present in a solar cell string.

BACKGROUND

A photovoltaic power generation system includes a solar cell string as a DC power source. The solar cell string includes a plurality of solar cell modules connected in series. Defects may arise in a solar cell string, such as malfunctions in solar cell modules or breakage in cables connecting solar cell modules to each other. When such a defect arises in a solar cell string, it is necessary to repair the defective location. Inspection apparatuses or inspection methods for inspecting whether or not there is a defect in a solar cell module or a solar cell string have been disclosed in the past.

JP 2012-238716A (published Dec. 6, 2012), JP 2016-93039A (published May 23, 2016), JP 2008-91828A (published Apr. 17, 2008), and JP 2009-21341A (published Jan. 29, 2009) are examples of the related art.

However, the solar cell panel abnormality detection apparatus disclosed in JP 2012-238716A is configured to determine whether or not there is a defect in one of a plurality of solar cell panels constituting a solar cell string, and whether or not there is a defect in a bypass diode connected between positive and negative terminals of the solar cell panel. The abnormality detection apparatus must therefore inspect each of the plurality of solar cell panels and each of the plurality of bypass diodes individually, and thus cannot easily determine whether or not there are defects in a plurality of locations in a solar cell string.

JP 2016-93039A describes an inspection method and an inspection apparatus that inspect a plurality of locations in a solar cell string for defects, where a cutout relay that cuts conduction partway along the solar cell string is used. In other words, the solar cell string is split into two strings by the cutout relay, and inspection values indicating whether or not there is a malfunction in a single location are obtained for each of the two strings. Thus like JP 2012-238716A, the inspection method and inspection apparatus according to JP 2016-93039A cannot easily determine whether or not there are defects in a plurality of locations in a solar cell string.

The solar cell array defect diagnostic methods disclosed in JP 2008-91828A and JP 2009-21341A, meanwhile, disclose techniques for inspecting whether or not there is a defect in a single location of a solar cell string, but neither disclose nor suggest determining whether or not there are defects in a plurality of locations.

Having been achieved in light of the above-described circumstances, one or more aspects may provide an inspection technique capable of easily determining whether or not there are defects in a plurality of locations of a solar cell string.

SUMMARY

To solve the above-described problem, an inspection apparatus for a photovoltaic power generation system according to one aspect is an inspection apparatus for a photovoltaic power generation system including a solar cell string having a plurality of solar cell modules connected in series between a positive terminal and a negative terminal. The apparatus includes: an inspection signal application unit configured to sequentially carry out inspection signal positive terminal application of applying an AC inspection signal to the positive terminal and inspection signal negative terminal application of applying the inspection signal to the negative terminal; an index value measurement unit configured to measure, during the inspection signal positive terminal application and during the inspection signal negative terminal application, an index value that varies in accordance with a number of the solar cell modules between the terminal where the inspection signal is applied to a position of a defect; and a plural defects detection unit configured to determine that there are at least two defects in the solar cell string in the case where a third index value found from a first index value, measured by the index value measurement unit during the inspection signal positive terminal application, and a second index value, measured by the index value measurement unit during the inspection signal negative terminal application, deviates from a reference index value of a solar cell string having no defects by greater than or equal to a predetermined first threshold.

According to this configuration, the third index value is found from the first index value and the second index value, which are measured by the index value measurement unit by applying the inspection signal to the positive terminal and the negative terminal, respectively. These index values vary in accordance with the number of solar cell modules between the terminal where the inspection signal is applied and the position of a defect. The plural defects detection unit compares a reference index value found for a solar cell string having no defects with the third index value, and determines whether or not the solar cell string is defective in at least two positions on the basis of whether or not the third index value deviates from the reference index value by greater than or equal to the first threshold. Accordingly, the inspection apparatus for a photovoltaic power generation system according to this aspect can easily determine whether or not the solar cell string is defective in a plurality of positions on the basis of a single inspection value, or in other words, on the basis of the third index value.

The index value that varies depending on the number of solar cell modules between the terminal where the inspection signal is applied and the position of the defect may, for example, be an impedance of the solar cell string measured during the application of the inspection signal. In this case, the third index value may be a combined impedance found from an impedance corresponding to the first index value and an impedance corresponding to the second index value.

According to another aspect, the inspection apparatus for a photovoltaic power generation system may further include: a defect position identification unit configured to, in the case where the plural defects detection unit has determined that there are at least two defects in the solar cell string, identify a position of a first defect of the at least two defects that is closest to the positive terminal on the basis of a ratio of the reference index value to the first index value, and identify a position of a second defect of the at least two defects that is closest to the negative terminal on the basis of a ratio of the reference index value to the second index value.

In this configuration, the index values are physical amounts that vary in accordance with the number of solar cell modules between the terminal where the inspection signal is applied and the position of a defect. The reference index value is a physical amount obtained by measuring the first index value or the second index value in the same manner for a solar cell string having no defects. The number of solar cell modules between the positive terminal and the position of the defect is reflected in the first index value measured by the index value measurement unit during the inspection signal positive terminal application. Thus by finding the ratio of the reference index value to the first index value, the position of the defect closest to the positive terminal can be identified. The position of the defect closest to the negative terminal can be identified in the same manner.

Note that if the identification of the position of the defect contains error, the phrase "identifies the position of the defect" may be replaced with "estimates the position of the defect".

According to another aspect, in the inspection apparatus for a photovoltaic power generation system, the plural defects detection unit may determine that there is one defect in the solar cell string in the case where the third index value deviates by greater than or equal to a second threshold set lower than the first threshold and by less than the first threshold.

According to this configuration, setting the second threshold lower than the first threshold and comparing the third index value with the first threshold and the second threshold makes it possible to determine that there is a defect in one position only.

According to another aspect, the inspection apparatus for a photovoltaic power generation system may further include a defect position identification unit configured to identify the position of only one defect on the basis of a ratio between the first index value and the second index value.

According to this configuration, in the case where the solar cell string has one defect, the position of the defect can be identified on the basis of the first index value and the second index value only.

According to another aspect, in the inspection apparatus for a photovoltaic power generation system, the first index value and the second index value are impedances of the solar cell string, and the third index value is a combined impedance found from the first index value and the second index value.

According to this configuration, the position of the defect can be identified on the basis of the impedance corresponding to the index value.

Additionally, to solve the above-described problem, an inspection apparatus for a photovoltaic power generation system according to one aspect is an inspection apparatus for a photovoltaic power generation system including a solar cell string having a plurality of solar cell modules connected in series between a positive terminal and a negative terminal. The apparatus includes: an inspection signal application unit configured to carry out at least one of inspection signal positive terminal application of applying an AC inspection signal to the positive terminal and inspection signal negative terminal application of applying the inspection signal to the negative terminal; an index value measurement unit configured to measure, during the inspection signal positive terminal application or during the inspection signal negative terminal application, an index value that varies in accordance with a number of the solar cell modules between the terminal where the inspection signal is applied to a position of incorrect construction; and a construction state determination unit configured to determine that the construction of the solar cell string is incorrect in the case where the index value deviates from a reference index value of a solar cell string having no defects by greater than or equal to a predetermined threshold.

According to this configuration, the construction state determination unit compares the index value measured by the index value measurement unit during either the inspection signal positive terminal application or the inspection signal negative terminal application with the reference index value. The construction state determination unit determines that the construction of the solar cell string is incorrect in the case where the index value deviates from the reference index value by greater than or equal to the predetermined threshold. Accordingly, the inspection apparatus for a photovoltaic power generation system according to this other aspect can determine whether or not the solar cell string is constructed correctly on the basis of a single inspection value, or in other words, on the basis of the index value.

Whether or not each solar cell module is properly grounded is an example of whether or not the construction is correct. The index value that varies depending on the number of solar cell modules between the terminal where the inspection signal is applied and the position of the incorrect construction may, for example, be an impedance of the solar cell string measured during the application of the inspection signal.

According to another aspect, in the inspection apparatus for a photovoltaic power generation system, the index value is an impedance of the solar cell string.

According to this configuration, the position of the incorrect construction can be identified on the basis of the impedance corresponding to the index value.

An inspection method for a photovoltaic power generation system according to one aspect includes: sequentially applying an AC inspection signal to a positive terminal and a negative terminal of a solar cell string having a plurality of solar cell modules connected in series, and for each of the terminals, measuring an index value that varies depending on a number of the solar cell modules between the terminal where the inspection signal is applied and a position of a defect; and determining that there are at least two defects in the solar cell string in the case where a third index value found from a first index value, corresponding to the index value obtained in the case where the inspection signal is applied to the positive terminal, and a second index value, corresponding to the index value obtained in the case where the inspection signal is applied to the negative terminal, deviates from a reference index value of a solar cell string having no defects by greater than or equal to a predetermined first threshold.

According to this method, whether or not the solar cell string is defective in a plurality of positions can be determined easily on the basis of a single inspection value, or in other words, on the basis of the third index value.

An inspection method for a photovoltaic power generation system according to one aspect includes: applying an AC inspection signal to a positive terminal or a negative terminal of a solar cell string having a plurality of solar cell modules connected in series, and measuring an index value that varies depending on a number of the solar cell modules between the terminal where the inspection signal is applied and a position of incorrect construction; and determining that the construction of the solar cell string is incorrect in the case where the index value deviates from a reference index value of a solar cell string having no defects by greater than or equal to a predetermined threshold.

According to this method, whether or not the solar cell string is constructed correctly can be determined easily on the basis of a single inspection value, or in other words, on the basis of the index value.

According to the configuration of one aspect, whether or not a solar cell string is defective in a plurality of positions can be determined easily.

DETAILED DESCRIPTION

First Embodiment

Figure 1:
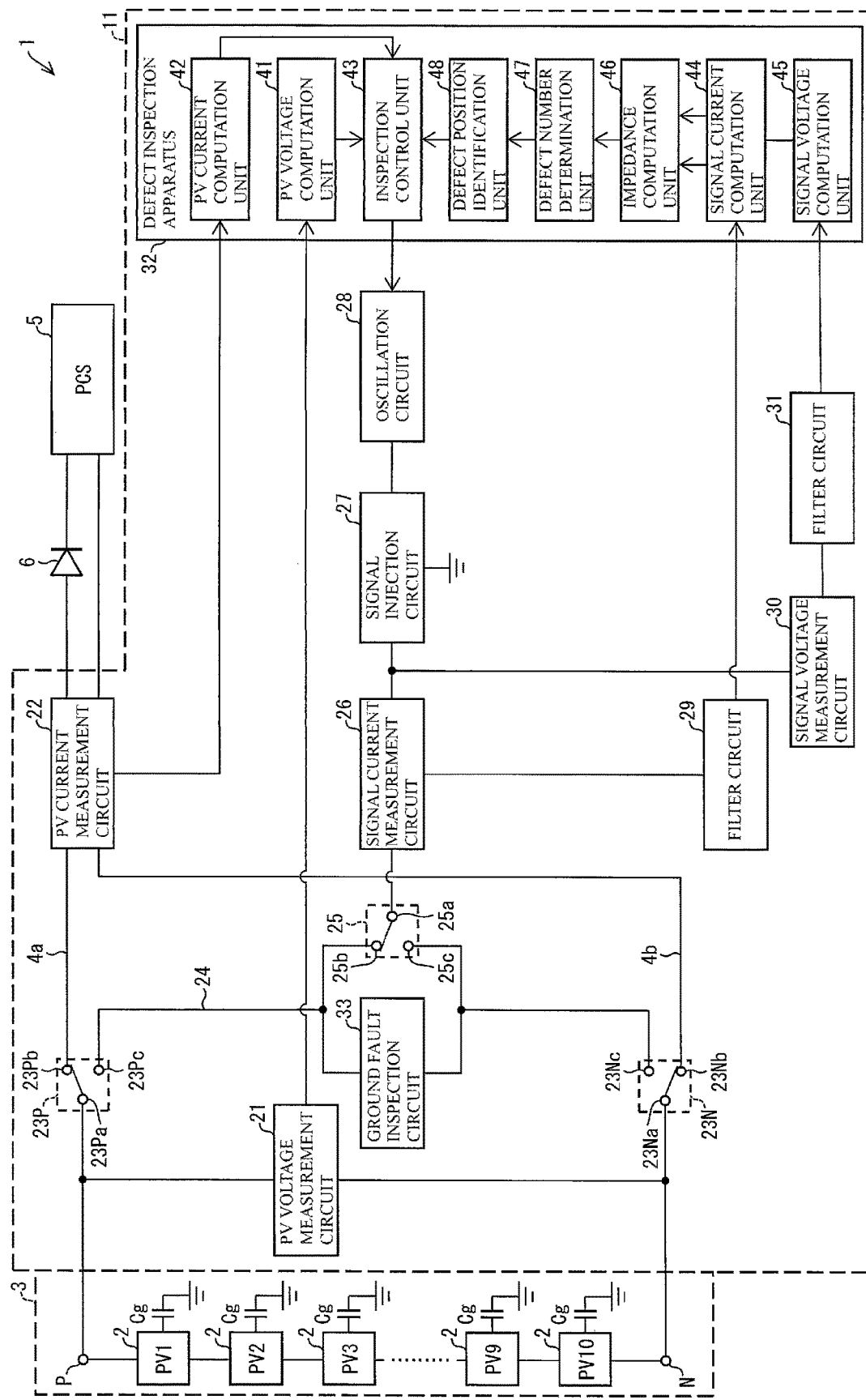
FIG. 1 is a block diagram illustrating the configuration of a photovoltaic power generation system including a photovoltaic power generation system inspection apparatus according to an embodiment.

Embodiments will be described hereinafter based on FIGS. 1 to 6. FIG. 1 is a block diagram illustrating the configuration of a photovoltaic power generation system 1 including an inspection apparatus 11 according to an embodiment.

Configuration of Photovoltaic Power Generation System 1

As illustrated in FIG. 1, the photovoltaic power generation system 1 includes a solar cell string 3 constituted of a plurality of solar cell modules 2 connected in series, and the inspection apparatus 11. Each solar cell module 2 includes a plurality of solar cells connected in series, and is formed as a panel. Power generated by the solar cell string 3 is supplied to a power conditioning system (PCS) 5 over power conducting paths 4a and 4b, which are power lines. A diode 6 for preventing backfeeding is provided in the power conducting path 4a, for example. Note that FIG. 1 illustrates a case where the solar cell string 3 includes ten solar cell modules 2 connected in series. A ground that grounds the solar cell modules 2 may be a frame, the earth, or a capacitance in the air, for example. Electrostatic capacitance $C_g$ arises between each solar cell module 2 and its ground.

Configuration of Inspection Apparatus 11

The inspection apparatus 11 inspects the solar cell string 3 for defects every predetermined period, such as every day or every few days, or when a predetermined condition is met. To that end, the inspection apparatus 11 includes a PV voltage measurement circuit 21, a PV current measurement circuit 22, switching relays 23P and 23N, an inspection conducting path 24, a switching relay 25, a signal current measurement circuit 26, a signal injection circuit 27, an oscillation circuit 28, a filter circuit 29, a signal voltage measurement circuit 30, a filter circuit 31, a defect inspection apparatus 32, and a ground fault inspection circuit 33.

Note that the inspection apparatus 11 is not limited to inspecting the solar cell string 3, and can inspect whether or not there are a plurality of disconnects in any DC power source string used for generating power or charging in the same manner as the solar cell string 3.

PV Voltage Measurement Circuit 21 and PV Current Measurement Circuit 22

The PV voltage measurement circuit 21 measures a voltage between a P terminal and an N terminal of the solar cell string 3, or in other words, an output voltage of the solar cell string 3. The result of this measurement is inputted to the defect inspection apparatus 32. The PV current measurement circuit 22 is provided in the power conducting paths 4a and 4b, and measures current flowing in the power conducting paths 4a and 4b, or in other words, output current of the solar cell string 3. The result of this measurement is inputted to the defect inspection apparatus 32.

Switching Relays 23P and 23N

The switching relays 23P and 23N are provided in the power conducting paths 4a and 4b, and switch a supply path of the power outputted from the solar cell string 3 between the PCS 5 side and the inspection conducting path 24 side. Specifically, a traveling contact 23Pa of the switching relay 23P is connected to the P terminal (positive terminal) of the solar cell string 3, a fixed contact 23Pb is connected to the PCS 5 via the PV current measurement circuit 22, and a fixed contact 23Pc is connected to the inspection conducting path 24. Likewise, a traveling contact 23Na of the switching relay 23N is connected to the N terminal (negative terminal) of the solar cell string 3, a fixed contact 23Nb is connected to the PCS 5 via the PV current measurement circuit 22, and a fixed contact 23Nc is connected to the inspection conducting path 24.

Switching Relay 25

The switching relay 25 is provided in the inspection conducting path 24, and switches a connection with an input terminal of the signal current measurement circuit 26 between the P terminal side and the N terminal side of the solar cell string 3. Specifically, a traveling contact 25a of the switching relay 25 is connected to the input terminal of the signal current measurement circuit 26, a fixed contact 25b is connected to the fixed contact 23Pc of the switching relay 23P via the inspection conducting path 24, and a fixed contact 25c is connected to the fixed contact 23Nc of the switching relay 23N via the inspection conducting path 24.

Oscillation Circuit 28 and Signal Injection Circuit 27

The oscillation circuit 28 is controlled by the defect inspection apparatus 32, and oscillates an inspection signal. The oscillation circuit 28 supplies the inspection signal to the signal injection circuit 27. The signal injection circuit 27 supplies the inspection signal generated by the oscillation circuit 28 to the P terminal of the solar cell string 3 via the switching relay 25 and the switching relay 23P. Alternatively, the signal injection circuit 27 supplies the stated inspection signal to the N terminal of the solar cell string 3 via the switching relay 25 and the switching relay 23N.

The inspection signal generated by the oscillation circuit 28 is preferably a sine wave AC signal. However, the inspection signal may be any type of AC signal. The frequency of the inspection signal may be within a range of 1 kHz to 1 MHz, for example.

Note that the signal injection circuit 27 and the oscillation circuit 28 constitute, with an inspection control unit 43 (described later), an inspection signal application unit.

Signal Current Measurement Circuit 26, Filter Circuits 29 and 31, and Signal Voltage Measurement Circuit 30

The signal current measurement circuit 26 measures an inspection signal current flowing in the solar cell string 3 in a state where the stated inspection signal is being supplied to the P terminal of the solar cell string 3 from the signal injection circuit 27 (called "inspection signal positive terminal application" hereinafter). The signal current measurement circuit 26 also measures an inspection signal current flowing in the solar cell string 3 in a state where the stated inspection signal is being supplied to the N terminal of the solar cell string 3 from the signal injection circuit 27 (called "inspection signal negative terminal application" hereinafter).

The filter circuit 29 is a low-pass filter or a band pass filter, and removes a noise component from the inspection signal current measured by the signal current measurement circuit 26. The inspection signal current processed by the filter circuit 29 is inputted to the defect inspection apparatus 32.

The signal voltage measurement circuit 30 measures a voltage of the stated inspection signal (an inspection signal voltage) in the case of inspection signal positive terminal application. The signal voltage measurement circuit 30 also measures the voltage of the stated inspection signal in the case of inspection signal negative terminal application.

The filter circuit 31 is a low-pass filter or a band pass filter, and removes a noise component from the inspection signal voltage measured by the signal voltage measurement circuit 30. The inspection signal voltage processed by the filter circuit 31 is inputted to the defect inspection apparatus 32.

Note that rather than including the filter circuits 29 and 31, the inspection apparatus 11 may be configured such that the defect inspection apparatus 32 performs the processing handled by the filter circuits 29 and 31 through digital signal processing (filtering). Furthermore, the current, voltage, and so on inputted to the defect inspection apparatus 32 from the PV voltage measurement circuit 21, the PV current measurement circuit 22, the filter circuit 29, and the filter circuit 31 may be inputted to the defect inspection apparatus 32 after being AD-converted by an AD converter (not shown). Alternatively, the stated AD conversion may be carried out within the defect inspection apparatus 32.

Ground Fault Inspection Circuit 33

The ground fault inspection circuit 33 inspects whether or not there is a ground fault in the solar cell string 3, and is, for example, provided in parallel with the switching relay 25 in the inspection conducting path 24. When a ground fault occurs in the solar cell string 3, impedances Zp and Zn (index values) cannot be obtained accurately when inspecting the solar cell string 3 for defects. Thus the inspection of the solar cell string 3 for defects cannot be carried out accurately. Accordingly, when inspecting the solar cell string 3 for defects, the solar cell string 3 is first inspected for a ground fault, and a result of the inspection is communicated to the defect inspection apparatus 32. It is preferable that the defect inspection performed by the defect inspection apparatus 32 be suspended when a ground fault has occurred in the solar cell string 3.

Methods for inspecting the solar cell modules 2 for ground faults are known. For example, the method disclosed in JP 2016-93039A can be employed, and thus the configuration and operations of the ground fault inspection circuit 33 will not be described here.

Defect Inspection Apparatus 32

The defect inspection apparatus 32 is constituted by a microcomputer including a CPU, and includes a PV voltage computation unit 41, a PV current computation unit 42, the inspection control unit 43, a signal current computation unit 44, a signal voltage computation unit 45, an impedance computation unit (index value measurement unit) 46, a defect number determination unit 47 (plural defects detection unit), and a defect position identification unit 48.

The PV voltage computation unit 41 converts the output voltage of the solar cell string 3 measured by the PV voltage measurement circuit 21 into data suitable for processing by the inspection control unit 43. The PV current computation unit 42 converts the output current of the solar cell string 3 measured by the PV current measurement circuit 22 into data suitable for processing by the inspection control unit 43.

The inspection control unit 43 determines whether or not the solar cell string 3 is in an inspectable state (described later) on the basis of data indicating the output voltage of the solar cell string 3 supplied from the PV voltage computation unit 41 and data indicating the output current of the solar cell string 3 supplied from the PV current computation unit 42. If as a result the inspection control unit 43 determines that the solar cell string 3 is in the inspectable state, the inspection control unit 43 controls the oscillation circuit 28 to adjust the frequency of the signal oscillated by the oscillation circuit 28 to a frequency favorable for the inspection signal. Furthermore, the inspection control unit 43 controls the switching of the switching relays 23P and 23N to connect the solar cell string 3 to the inspection conducting path 24.

The signal current computation unit 44 converts the inspection signal current measured by the signal current measurement circuit 26 and processed by the filter circuit 29 into data suitable for processing by the impedance computation unit 46. The signal voltage computation unit 45 converts the inspection signal voltage measured by the signal voltage measurement circuit 30 and processed by the filter circuit 31 into data suitable for processing by the impedance computation unit 46.

The impedance computation unit 46 calculates the impedance Zp (a first index value) in the solar cell string 3 for the case of inspection signal positive terminal application on the basis of the data supplied from the signal current computation unit 44 and the signal voltage computation unit 45. The impedance computation unit 46 also calculates the impedance Zn (a second index value) for the case of inspection signal negative terminal application. Furthermore, the impedance computation unit 46 calculates a combined impedance Zpn (a third index value) from the impedances Zp and Zn. The combined impedance Zpn is calculated using the formula $1/Zpn=1/Zp+1/Zn$.

The defect number determination unit 47 determines whether or not there is a defect in the solar cell string 3 on the basis of the combined impedance Zpn outputted from the impedance computation unit 46. If there is a defect in the solar cell string 3, the defect number determination unit 47 also determines the number of defective locations. Here, the "number of defective locations" in the solar cell string 3 includes at least one of the number of defective solar cell modules 2 and the number of disconnected cables. A method by which the defect number determination unit 47 determines the number of defective locations will be described in detail later.

The defect position identification unit 48 identifies the position of the defect(s) when the defect number determination unit 47 has determined that there is a defect in one or a plurality of locations of the solar cell string 3. The defect position identification unit 48 identifies the position of the defect(s) using different methods depending on whether only one location in the solar cell string 3 is defective or a plurality of locations are defective. The methods by which the defect position identification unit 48 identifies the position of the defect(s) will be described in detail later.

Method of Determining Number of Defective Locations

The defect number determination unit 47 determines whether or not the combined impedance Zpn calculated according to the above-described formula deviates from a reference impedance Z0 (a reference index value) by greater than or equal to a predetermined first threshold. If the result of this determination indicates that the combined impedance Zpn deviates from the reference impedance Z0 by greater than or equal to the first threshold, the defect number determination unit 47 determines that the solar cell string 3 is defective in at least two locations.

The reference impedance Z0 is, for example, the average value of an impedance Zp0 during inspection signal positive terminal application and an impedance Zn0 during inspection signal negative terminal application when there are no defects in the solar cell string 3. Alternatively, the combined impedance may be found from the impedances Zp0 and Zn0 according to the formula described above.

The stated threshold is set on the basis of, for example, a ratio Zpn/Z0. For example, the ratio Zpn/Z0 when there are defects in two locations of the solar cell string 3 will be greater than the ratio Zpn/Z0 when there is a defect in one location of the solar cell string 3. Accordingly, the predetermined first threshold used to determine whether or not there are defects in two locations is set greater than a predetermined second threshold used to determine whether or not there is a defect in one location. In other words, when the ratio Zpn/Z0 is greater than the second threshold but lower than the first threshold, the defect number determination unit 47 determines that there is a defect in one location. Meanwhile, when the ratio Zpn/Z0 is greater than or equal to the first threshold, the defect number determination unit 47 determines that there are defects in two locations. A specific example of defect determination will be described later.

Inspectable State of Solar Cell String 3

In an embodiment, the inspectable state of the solar cell string 3 is a state in which the solar cell string 3 is generating power and the amount of power generated (the output current) is less than or equal to a predetermined threshold. Accordingly, when the solar cell string 3 is in the inspectable state and a specified inspection period has arrived, the inspection control unit 43 controls the switching relays 23P and 23N so that the traveling contact 23Pa of the switching relay 23P is switched to the fixed contact 23Pc side and the traveling contact 23Na of the switching relay 23N is switched to the fixed contact 23Nc side. The P terminal and N terminal of the solar cell string 3 are connected to the inspection conducting path 24 as a result.

Figure 2:
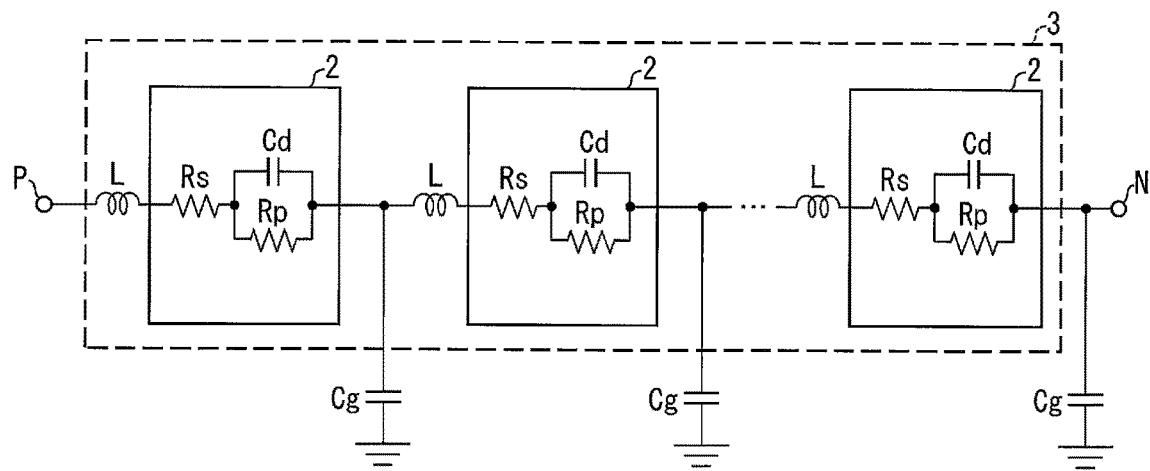
FIG. 2 is a circuit diagram illustrating an RLC equivalent circuit representing a solar cell string, such as in FIG. 1, in a case where the solar cell string is in a non-power-generating state.
Figure 3:
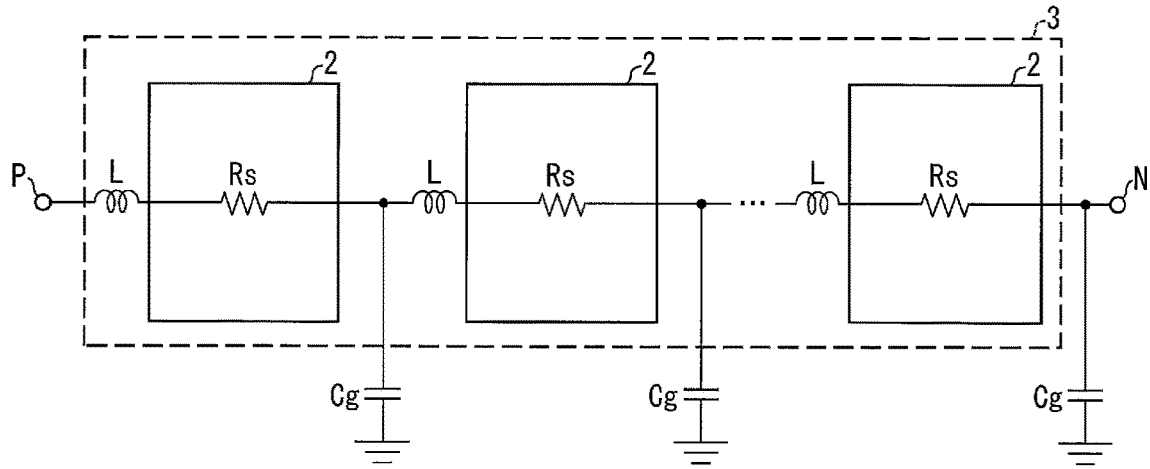
FIG. 3 is a circuit diagram illustrating an equivalent circuit of a solar cell string, such as in FIG. 1, in a case where the solar cell string is in a power-generating state, corresponding to FIG. 4.

The reason why the inspectable state is a state in which the solar cell string 3 is generating power and the amount of power generated is less than or equal to a predetermined threshold is as follows. FIG. 2 is a circuit diagram of an RLC equivalent circuit representing the solar cell string 3, in a case where the solar cell string 3 is in a non-power-generating state. FIG. 3 is a circuit diagram of an equivalent circuit of the solar cell string 3, in a case where the solar cell string 3 is in a power-generating state, corresponding to FIG. 2.

When the solar cell string 3 is in the non-power-generating state, the solar cell modules 2 include a serial resistance Rs and a junction capacitance Cd and a parallel resistance Rp at a pn junction, as illustrated in FIG. 2. Meanwhile, L indicates an inductance in joining lines between the solar cell modules 2, and Cg indicates the electrostatic capacitance Cg of the solar cell modules 2 with respect to the ground.

On the other hand, when the solar cell string 3 is in the power-generating state, the solar cell modules 2 include only the serial resistance Rs, as illustrated in FIG. 3. In this case, the serial resistance Rs is at an extremely low value such as less than or equal to 1Ω. The inductance L, too, is at an extremely low value with respect to the electrostatic capacitance Cg. Thus when the solar cell string 3 is in the power-generating state, the impedance Zp of the solar cell string 3 in the case of inspection signal positive terminal application and the impedance Zn of the solar cell string 3 in the case of inspection signal negative terminal application can be found accurately.

A state in which the amount of power generated by the solar cell string 3 is less than or equal to a predetermined threshold is a state in which, when the solar cell string 3 is changed from being connected to the PCS 5 to being connected to the inspection conducting path 24, the amount of power generated is low enough so that there are no negative effects due to arcing when the switching relays 23P and 23N are switched. Thus setting such conditions as the conditions of the inspectable state makes it possible to use inexpensive and low-breakdown voltage relays as the switching relays 23P and 23N, and carry out the switching operations easily and safely.

Specific Example of Determining Number of Defective Locations

Figure 6:
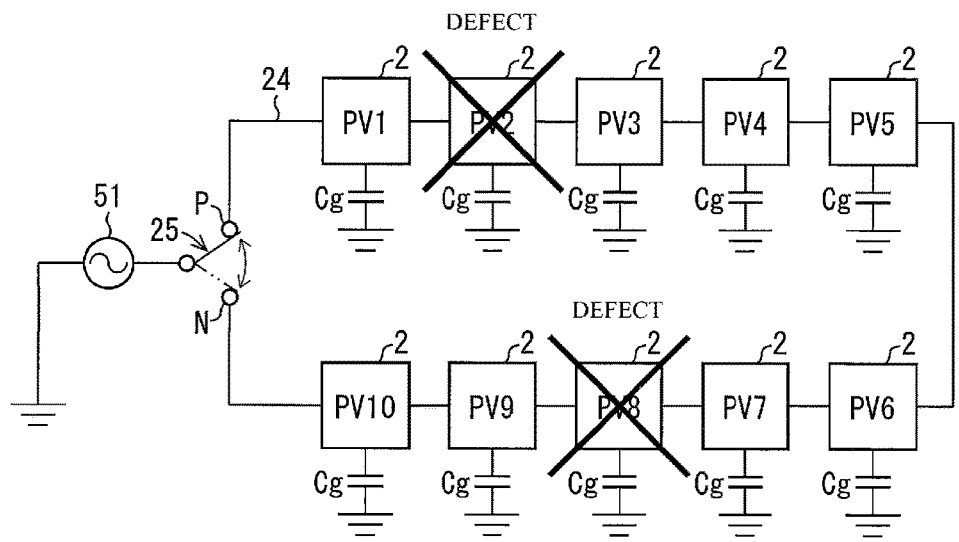
FIG. 6 is a schematic circuit diagram illustrating an example of an inspection apparatus, such as in FIG. 1 inspecting a solar cell string for defects.

FIG. 6 is a schematic circuit diagram illustrating an example of the inspection apparatus 11 illustrated in FIG. 1 inspecting the solar cell string 3 for defects. In FIG. 6, during inspection signal positive terminal application, the switching relay 25 is switched so that the inspection signal is injected between the P terminal (positive terminal) of the solar cell string 3 and the ground to measure the impedance of the solar cell string 3. Likewise, during inspection signal negative terminal application, the switching relay 25 is switched so that the inspection signal is injected between the N terminal (negative terminal) of the solar cell string 3 and the ground to measure the impedance of the solar cell string 3.

As described earlier, the impedance of the solar cell string 3 when there are no defects during the inspection signal positive terminal application is expressed by Zp0, whereas the impedance during the inspection signal negative terminal application is expressed by Zn0. Meanwhile, the impedance of the solar cell string 3 when there are defects during the inspection signal positive terminal application is expressed by Zp, whereas the impedance during the inspection signal negative terminal application is expressed by Zn.

For example, measurement results when there are no defects in the solar cell string 3 is Zp0=1591Ω and $Zn0=1602\Omega$. Accordingly, the impedance of the solar cell string 3 when there are no defects is taken as approximately $1600\Omega$, and this is used as the reference impedance $Z0$.

A case where there are defects in the solar cell string 3 will be described next. Assume that, for example, of the ten solar cell modules 2 connected in series in the solar cell string 3, there are defects in the second and eighth modules, counting from the P terminal of the solar cell string 3, as illustrated in FIG. 6. In this example, the results of measuring the impedance give $Zp=7055\Omega$ and $Zn=6992\Omega$. Finding the combined impedance $Zpn$ from $Zp$ and $Zn$ gives $Zpn=3512\Omega$. Such being the case, $Zpn/Z0=3512/1600\approx2.2$.

On the other hand, when only the eighth solar cell module 2, counting from the P terminal of the solar cell string 3, is defective, the results of measuring the impedance give $Zp=1850\Omega$ and $Zn=6993\Omega$. Finding the combined impedance $Zpn$ from $Zp$ and $Zn$ gives $Zpn=1463\Omega$. Such being the case, $Zpn/Z0=1463/1600\approx0.91$.

It can be seen from the above results that the ratio of the combined impedance $Zpn$ to the reference impedance $Z0$ reflects the number of defects, namely, that the ratio is greater when there are two defects than when there is one defect. Thus if thresholds that increase in steps, such as the aforementioned second threshold being less than the first threshold, are set for the ratio found in this manner, the defect number determination unit 47 can determine whether there is only one defect, or if there are two defects.

Method for Identifying Position of Defect

The defect position identification unit 48 identifies what position in the solar cell string 3 is defective when the defect number determination unit 47 has determined that there is a defect in one or a plurality of locations of the solar cell string 3. The method by which the defect position identification unit 48 identifies the position of the defect(s) differs depending on whether there is only one defect in the solar cell string 3 or there are a plurality of defects in the solar cell string 3. It is assumed here that the solar cell string 3 includes m solar cell modules 2.

a: One Defect Only

In this case, the defect position identification unit 48 identifies the position of the one defect in the solar cell string 3 through the following calculation formula.

(position of defect as seen from $P$ terminal side):
(position of defect as seen from $N$ terminal side)$=(1/Zp):(1/Zn)=Zn:Zp$ For example, when $m=10$, $Zp=1850\Omega$, and $Zn=6993\Omega$, the defect position identification unit 48 calculates the position of the defect in the following manner.

(position of defect as seen from P terminal side):(position of defect as seen from N terminal side)

$$= Zn:Zp$$
$$= 6993:1850$$
$$= 6993/(6993+1850):1850/(6993+1850)$$
$$\approx 0.79:0.21$$
$$\approx 8:2$$

In the above example, when a defect occurs at a position that internally divides the solar cell string 3 constituted by ten solar cell modules into 8:2, the defect position identification unit 48 can identify the defect. More specifically, it can be understood that a cable is likely disconnected between the eighth and ninth solar cell modules 2, counting from the P terminal side, or that one of those eighth and ninth solar cell modules 2 is likely defective.

b: Plurality of Defects

In this case, the defect position identification unit 48 identifies the positions of two defects among a plurality of defects in the solar cell string 3 through the following calculation formula.

(position of first defect closest to $P$ terminal)=(reference impedance $Z0$)/$Zp\times m$ (position of second defect closest to $N$ terminal)= (reference impedance $Z0$)/$Zn\times m$ For example, when $m=10$, $Z0=1600$ $\Omega$, $Zp=7055\Omega$, and $Zn=6992\Omega$, the defect position identification unit 48 calculates the position of the first defect closest to the P terminal in the following manner.

$Z0/Zp\times m=1600/7055\times 10\approx 2.2$

In the above example, it can be understood that a cable is likely disconnected between the second and third solar cell modules 2, counting from the P terminal side, or that at least one of those second and third solar cell modules 2, counting from the P terminal side, is likely defective.

Additionally, under the same conditions as above, the defect position identification unit 48 calculates the position of the second defect closest to the N terminal in the following manner.

$Z0/Zn\times m=1600/6992\times 10\approx 2.2$

It can thus be understood that a cable is likely disconnected between the second and third solar cell modules 2, counting from the N terminal side, or that at least one of those second and third solar cell modules 2, counting from the N terminal side (the eighth and ninth, counting from the P terminal side), is likely defective.

Thus when a plurality of defects occur in the solar cell string 3, the defect position identification unit 48 identifies the position of the first defect closest to the P terminal and the position of the second defect closest to the N terminal.

Operations of Inspection Apparatus 11: Inspection Method

Figure 4:
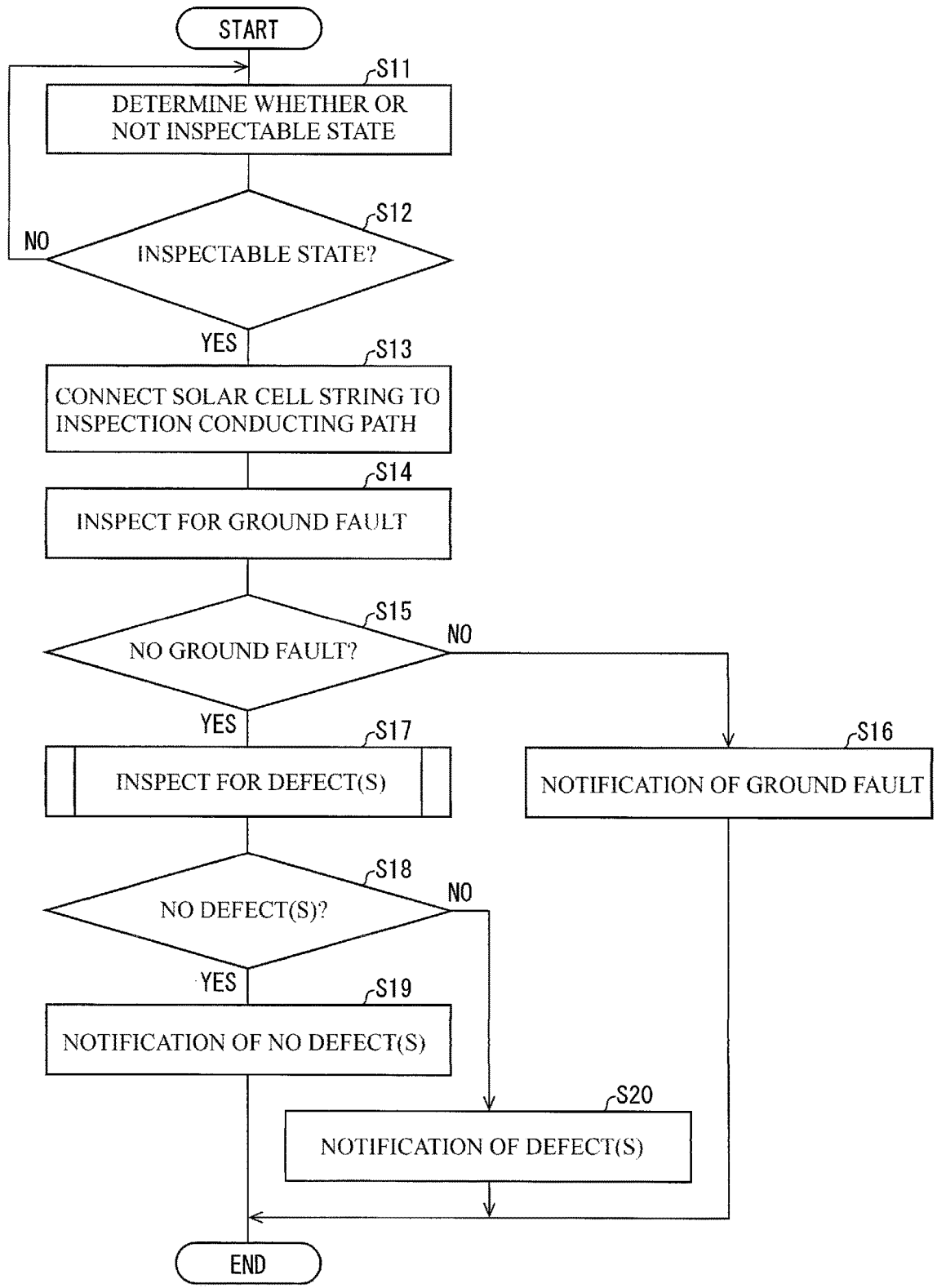
FIG. 4 is a flowchart illustrating operations of an inspection apparatus, such as in FIG. 1.

FIG. 4 is a flowchart illustrating operations of the inspection apparatus 11. When the solar cell string 3 is to be inspected, the inspection control unit 43 of the inspection apparatus 11 determines whether or not the solar cell string 3 is in the aforementioned inspectable state (S11).

If the solar cell string 3 is in the inspectable state (YES in S12), the inspection control unit 43 switches the switching relays 23P and 23N to connect the P terminal and the N terminal of the solar cell string 3 to the inspection conducting path 24 in order (S13).

Next, the ground fault inspection circuit 33 of the inspection apparatus 11 inspects whether or not a ground fault has occurred in the solar cell string 3 (S14). If a ground fault has occurred (NO in S15), the inspection apparatus 11 notifies a device managing the photovoltaic power generation system 1 (not shown) that a ground fault has occurred in the solar cell string 3 (S16). In this case, the defect inspection apparatus 32 of the inspection apparatus 11 does not inspect the solar cell string 3 for defects. The reason for this is as follows. When a ground fault has occurred in the solar cell string 3, the index values (impedance, for example) obtained when the inspection signal is applied to the positive terminal and the negative terminal of the solar cell string 3 during the inspection of the solar cell string 3 for defects are inaccurate. Thus the inspection of the solar cell string 3 for defects cannot be carried out accurately. Accordingly, when inspecting the solar cell string 3 for defects, it is preferable to first inspect the solar cell string 3 for a ground fault and suspend the defect inspection if a ground fault has occurred. This makes it possible to prevent a situation in which the solar cell string 3 is wastefully inspected for defects.

Note that if the ground fault inspection circuit 33 can measure a ground fault resistance and an amount of change in the impedances Zp and Zn caused by the ground fault resistance can be estimated, the solar cell string 3 may be inspected for defects even if a ground fault has occurred. In other words, the processes of S15 and S16 may be omitted.

Meanwhile, if a ground fault has not occurred (YES in S15), the defect inspection apparatus 32 of the inspection apparatus 11 starts inspecting the solar cell string 3 for defects (S17).

If the result of the defect inspection performed by the defect inspection apparatus 32 indicates that there are no defects in the solar cell string 3 (YES in S18), the inspection apparatus 11 notifies the device managing the photovoltaic power generation system 1, a user, and so on that there are no defects in the solar cell string 3 (S19). These notifications may be made using text, audio, or the like, through a user interface. On the other hand, if the result of the defect inspection indicates that a defect has been found in the solar cell string 3 (NO in S18), the inspection apparatus 11 notifies the device managing the photovoltaic power generation system 1, a user, and so on that a defect has been found in the solar cell string 3 (S20). The inspection apparatus 11 also provides information of the number and position of the defects in the solar cell string 3. The operations of the inspection apparatus 11 then end.

Operation of Defect Inspection Apparatus 32

Figure 5:
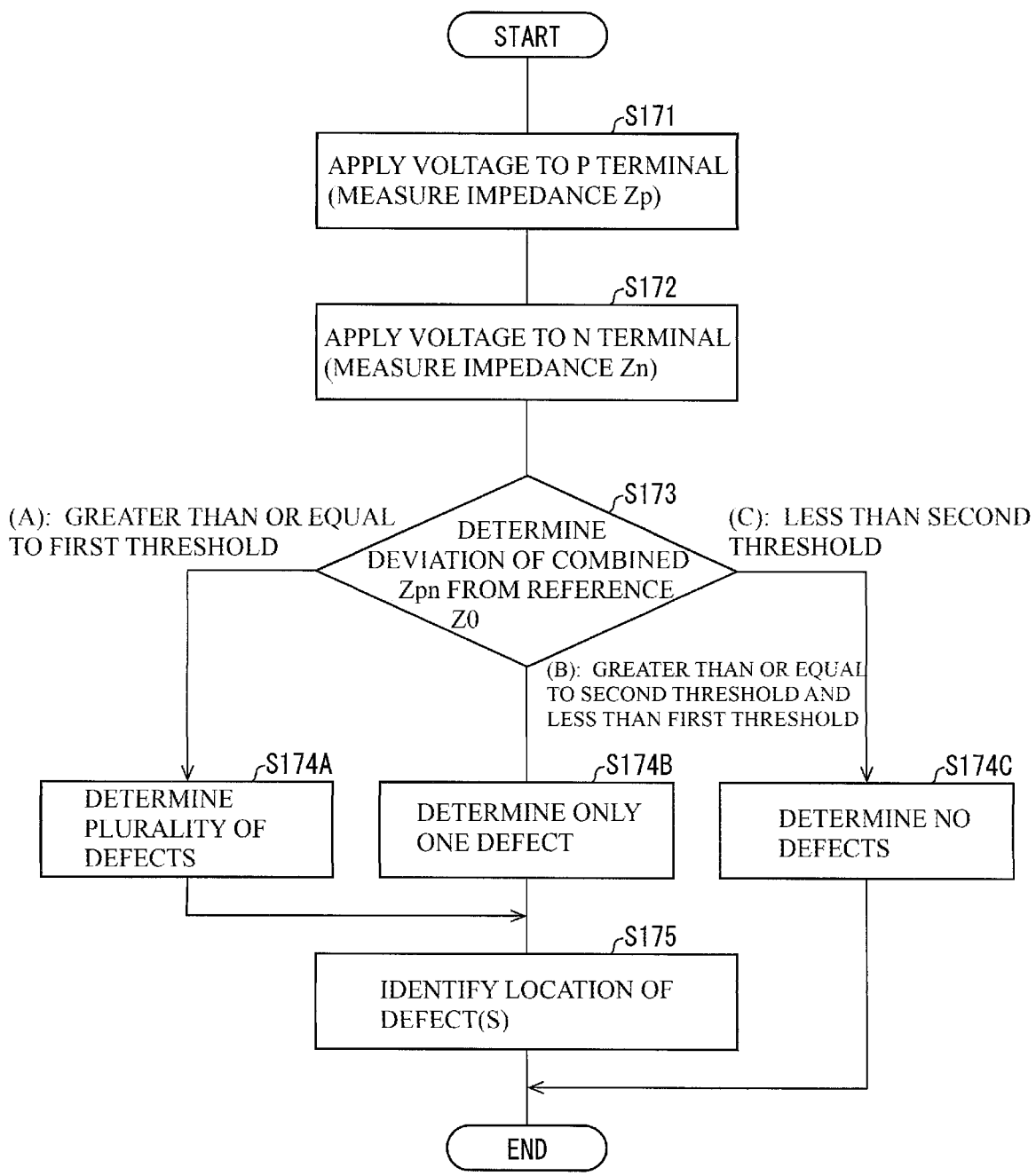
FIG. 5 is a flowchart illustrating operations of a defect inspection apparatus including an inspection apparatus, such as in FIG. 1.

Operations of the defect inspection apparatus 32 in S17 of the above-described operations of the inspection apparatus 11 (FIG. 4) will be described using FIGS. 5 and 6. FIG. 5 is a flowchart illustrating operations of the inspection apparatus 32. Assume that in the solar cell string 3 illustrated in FIG. 6, counting from the P terminal side, a cable is disconnected between the second solar cell module 2 (PV2, in FIG. 6) and the third solar cell module 2 (PV3, in FIG. 6). Furthermore, assume that, counting from the N terminal side, a cable is disconnected between the second solar cell module 2 (PV9, in FIG. 6) and the third solar cell module 2 (PV8, in FIG. 6).

As illustrated in FIG. 5, in S171 (an index value measurement step), the signal injection circuit 27 of the inspection apparatus 11 injects an inspection signal 51 (see FIG. 6) between the P terminal of the solar cell string 3 and the ground illustrated in FIG. 6. At this time, the switching relay 25 is connected to the P terminal of the solar cell string 3. In this case, a measurement current I based on the inspection signal 51 traverses the solar cell modules 2 indicated by PV1 and PV2 in FIG. 6 and flows back to the ground. The impedance computation unit 46 measures the impedance Zp during the inspection signal positive terminal application (the first index value) on the basis of the measurement current I measured by the signal current measurement circuit 26 and a measurement voltage measured by the signal voltage measurement circuit 30.

Next, in S172 (an index value measurement step), the signal injection circuit 27 injects the inspection signal 51 between the N terminal of the solar cell string 3 and the ground. At this time, the connection destination of the switching relay 25 is switched to the N terminal of the solar cell string 3. In this case, the inspection signal 51 traverses the solar cell modules 2 indicated by PV10 and PV9 in FIG. 6 and flows back to the ground. The impedance computation unit 46 measures the impedance Zn during the inspection signal negative terminal application (the second index value) on the basis of the measurement current I measured by the signal current measurement circuit 26 and the measurement voltage measured by the signal voltage measurement circuit 30.

The impedance computation unit 46 notifies the defect number determination unit 47 of the measured impedances Zp and Zn, and the combined impedance Zpn found from the impedances Zp and Zn. Additionally, the defect number determination unit 47 notifies the defect position identification unit 48 of the impedances Zp and Zn. Note that the impedance computation unit 46 may notify the defect position identification unit 48 of the impedances Zp and Zn.

The defect number determination unit 47 determines the degree to which the combined impedance Zpn deviates from the reference impedance Z0. For example, as described above, it is determined whether a ratio RT of Zpn/Z0 is greater than or equal to the aforementioned first threshold or second threshold (S173). If the ratio RT is greater than or equal to the first threshold (A in S173), the defect number determination unit 47 determines that there are defects in a plurality of (at least two) locations in the solar cell string 3 (S174A; a defect determination step). On the other hand, if the ratio RT is less than the first threshold and greater than or equal to the second threshold (B in S173), the defect number determination unit 47 determines that there is a defect in only one location in the solar cell string 3 (S174B). However, if the ratio RT is less than the second threshold (C in S173), the defect number determination unit 47 determines that there are no defects in the solar cell string 3 (S174C).

If there defects in a plurality of locations in the solar cell string 3 (S174A), the defect position identification unit 48 identifies the positions of the defects in the solar cell string 3 through the method described earlier on the basis of the reference impedance Z0 and the impedances Zp and Zn (S175). If there is a defect in one location in the solar cell string 3 (S174B), too, the defect position identification unit 48 identifies the position of the defect in the solar cell string 3 through the method described earlier on the basis of the impedances Zp and Zn (S175). The operations of the defect inspection apparatus 32 in S17 of FIG. 3 then end.

Second Embodiment

Another embodiment is as follows, described on the basis of FIG. 7. To simplify the descriptions, elements having the same functions as the elements described in the above embodiment will be given the same reference numerals and not described.

Figure 7:
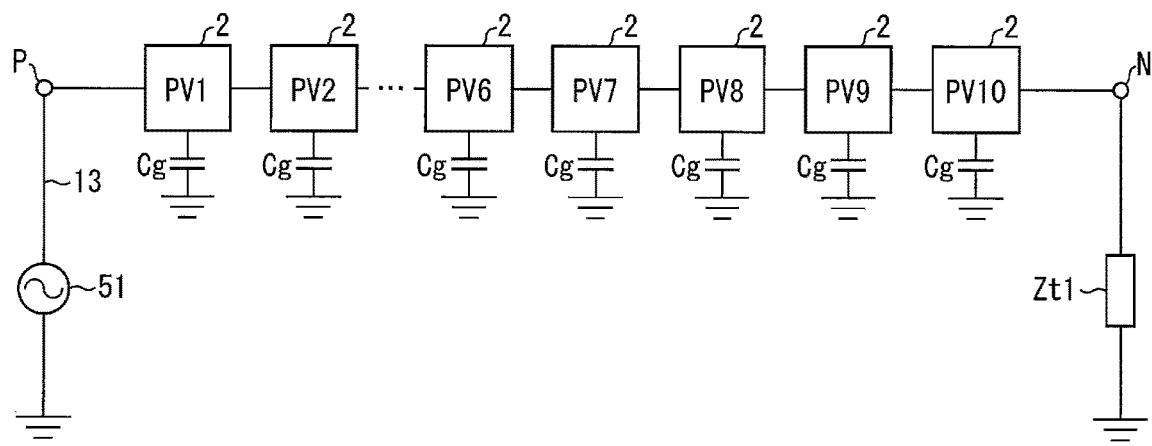
FIG. 7 is a schematic circuit diagram illustrating defect inspection according to another embodiment.

FIG. 7 is a schematic circuit diagram illustrating the inspection apparatus 11 according to an embodiment inspecting the solar cell string 3 for defects. In FIG. 7, the inspection signal 51 is applied to the P terminal of the solar cell string 3. As illustrated in FIG. 7, the N terminal on the side opposite from the P terminal to which the inspection signal 51 is applied is grounded via a terminal impedance Zt1. Note that when the inspection signal 51 is applied to the N terminal of the solar cell string 3, the terminal impedance Zt1 is connected to the P terminal and the P terminal is grounded via the terminal impedance Zt1.

According to the configuration described above, when inspecting the solar cell string 3 for defects, the terminal, of the P terminal and the N terminal of the solar cell string 3, that is opposite from the terminal to which the inspection signal is applied, is grounded via the terminal impedance Zt1. This makes it difficult for noise to enter the inspection signal. The impedances Zp and Zn found by measuring the inspection signal current and the inspection signal voltage are thus accurate impedances.

Note that a capacitor producing impedance, or an impedance element such as a resistor or an inductance, can be used as the terminal impedance Zt1.

Third Embodiment

Another embodiment is as follows, described with reference to FIGS. 8A to 8C. To simplify the descriptions, elements having the same functions as the elements described in the above embodiment will be given the same reference numerals and not described.

Figure 8A:
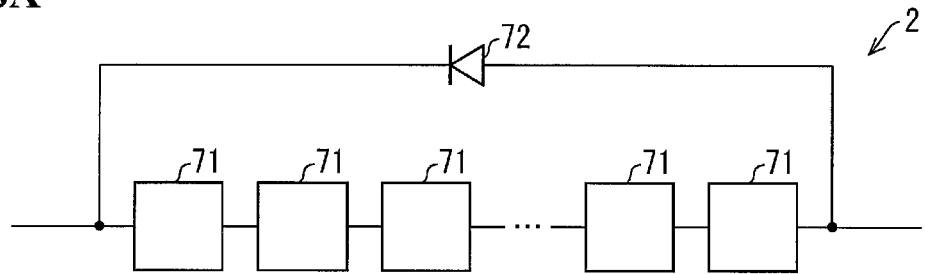
FIG. 8A is a schematic circuit diagram in which a bypass diode has been added to a plurality of solar cells connected in series to form a solar cell module.
Figure 8B:
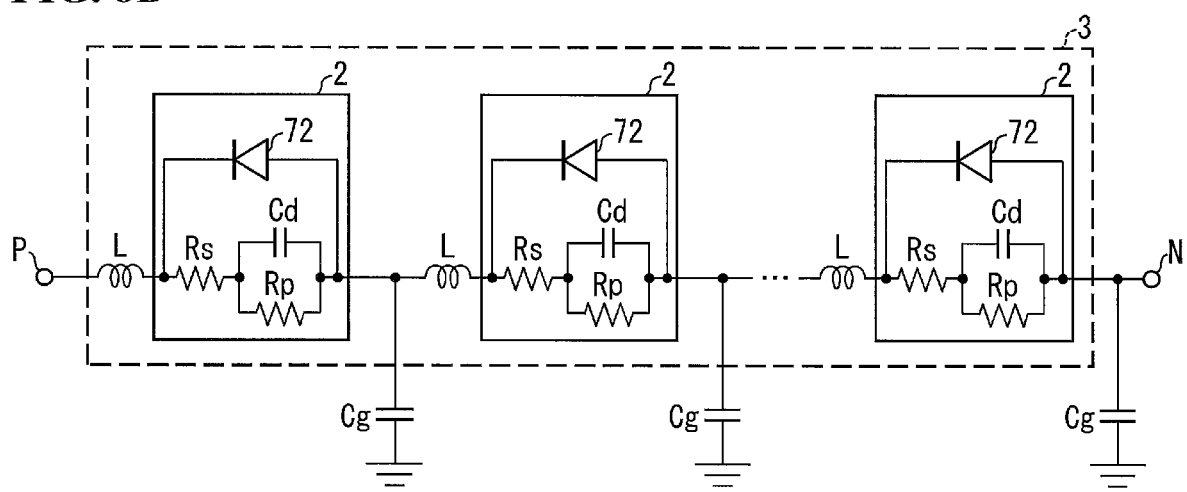
FIG. 8B is a circuit diagram in which a bypass diode has been added to the circuit diagram illustrated in FIG. 2.
Figure 8C:
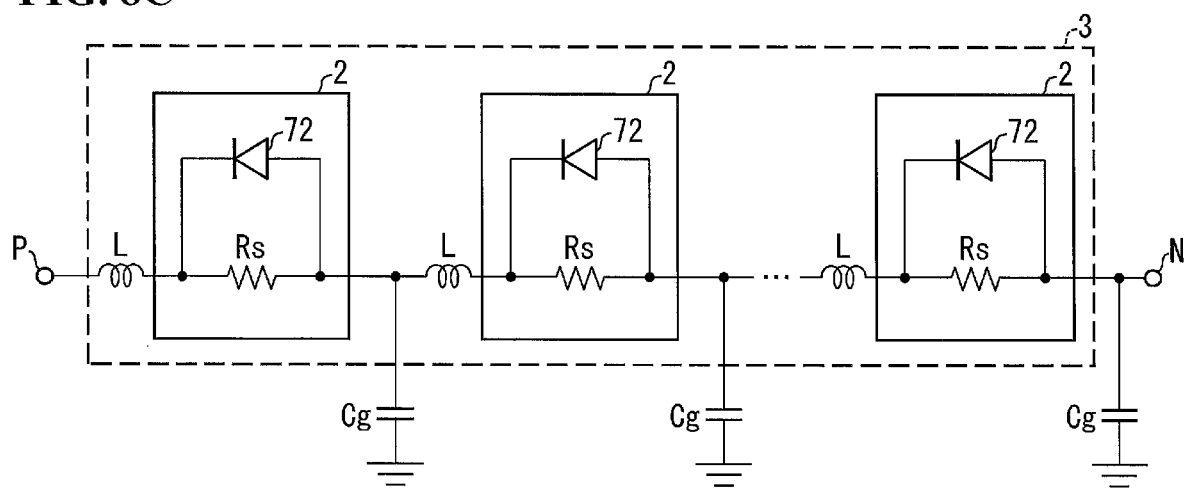
FIG. 8C is a circuit diagram in which a bypass diode has been added to the circuit diagram illustrated in FIG. 3, in an inspection apparatus according to yet another embodiment.

FIG. 8A is a schematic circuit diagram in which a bypass diode 72 has been added to a plurality of solar cells 71 connected in series to form the solar cell module 2. FIG. 8B is a circuit diagram in which the bypass diode 72 has been added to the circuit diagram illustrated in FIG. 2, and FIG. 8C is a circuit diagram in which the bypass diode 72 has been added to the circuit diagram illustrated in FIG. 3.

As illustrated in FIG. 8A, the solar cell module 2 is constituted by a plurality of solar cells 71 connected in series, and the bypass diode 72 is connected in parallel to the plurality of solar cells 71 connected in series. With the bypass diode 72, the anode is connected to the negative terminal of the solar cell module 2, and the cathode is connected to the positive terminal of the solar cell module 2. By providing the bypass diode 72 in this manner, current can traverse the bypass diode 72 even if a defect such as a disconnect or a cell defect occurs in the solar cell module 2 and current can no longer traverse the plurality of solar cells 71 connected in series. Accordingly, the solar cell string 3 can continue to output generated power even if there is a solar cell module 2 in which a defect has occurred.

According to an embodiment, in a configuration where the bypass diode 72 is provided in the solar cell module 2, the inspection apparatus 11 can perform an accurate inspection without being affected by the bypass diode 72. In other words, the inspection apparatus 11 applies a signal at an extremely low voltage, which is not affected by the bypass diode provided in the solar cell module 2, as the inspection signal supplied from the signal injection circuit 27 to the solar cell string 3. Almost no current flows in the bypass diode 72 when a voltage lower than the forward voltage is applied. The inspection apparatus 11 therefore uses a signal at a voltage lower than the forward voltage of the bypass diode 72 as the inspection signal 51.

This makes it possible to ensure a situation in which almost no measurement current flows in the bypass diode 72. The impedances Zp and Zn during the inspection signal positive terminal application and the inspection signal negative terminal application can thus be found accurately, which makes it possible to accurately inspect the solar cell string 3 for defects.

Fourth Embodiment

Another embodiment is as follows, described with reference to FIG. 9. To simplify the descriptions, elements having the same functions as the elements described in the above embodiment will be given the same reference numerals and not described.

The inspection apparatus 11 according to an embodiment generates the inspection signal 51 using power generated by the solar cell string 3. FIG. 9 is a circuit diagram illustrating a configuration in which the inspection signal 51 is applied to the solar cell string 3 in the inspection apparatus 11 according to an embodiment.

Figure 9:
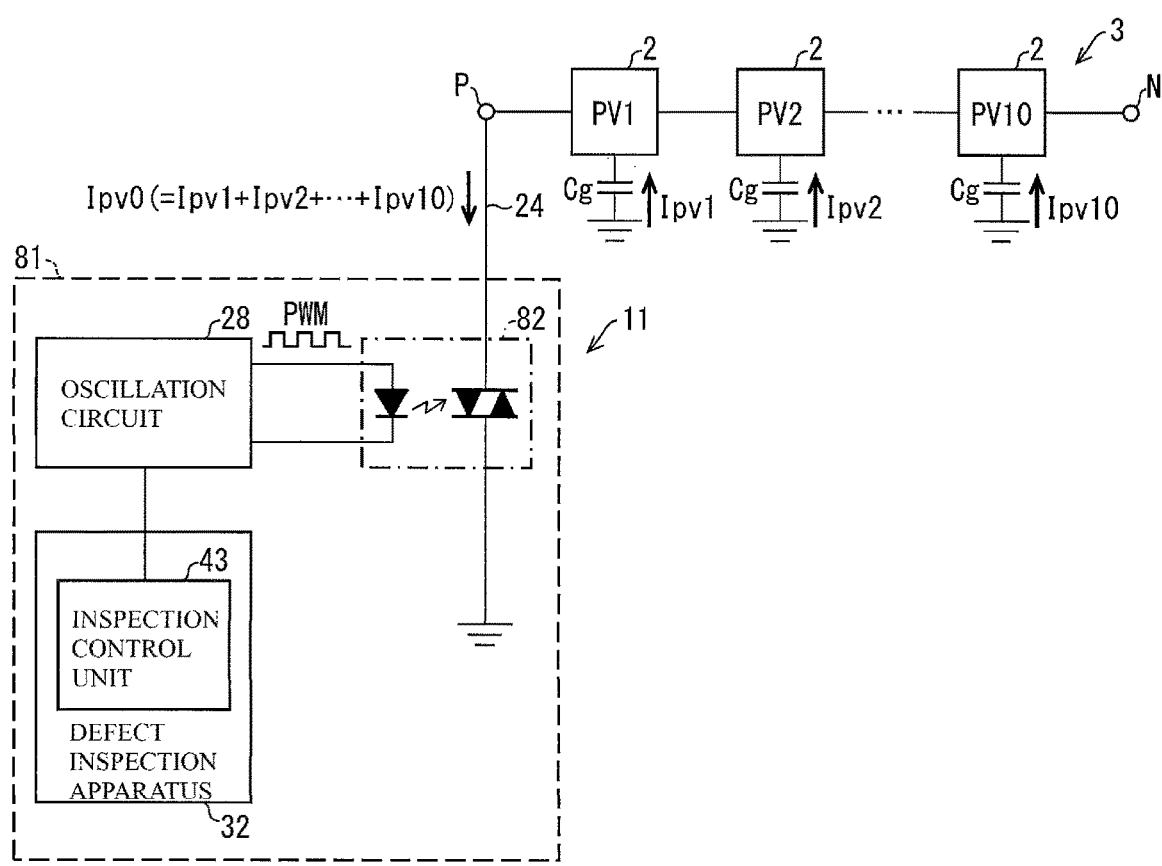
FIG. 9 is a circuit diagram illustrating a configuration in which an inspection signal is applied to a solar cell string in an inspection apparatus according to yet another embodiment.

As illustrated in FIG. 9, the inspection apparatus 11 according to an embodiment includes an inspection signal generation circuit 81. The inspection signal generation circuit 81 is constituted by the inspection control unit 43 of the defect inspection apparatus 32, the oscillation circuit 28, and a solid-state relay (SSR) 82.

As described above, the inspection control unit 43 controls the oscillation circuit 28 to adjust the frequency of the signal oscillated by the oscillation circuit 28 to a frequency favorable for the inspection signal. The oscillation circuit 28 oscillates a pulse width modulation (PWM) signal supplied to the SSR 82. The SSR 82 is provided in a conducting path between the P terminal (in the case of FIG. 9) of the solar cell string 3 and the ground, and opens/closes the conducting path on the basis of the PWM signal outputted from the oscillation circuit 28. A state in which an AC inspection signal 51 is applied to the P terminal of the solar cell string 3 can thus be achieved, and thus a signal current Ipv0 can flow from the P terminal of the solar cell string 3 to the inspection conducting path 24 as the inspection signal 51.

FIG. 9 illustrates a case of the inspection signal positive terminal application. During the inspection signal negative terminal application, the inspection signal generation circuit 81 is connected to the N terminal of the solar cell string 3. The SSR 82 is a switching element, and thus a different kind of switching element may be used instead.

According to the configuration described above, the inspection signal 51 applied to the solar cell string 3 is generated using power from the solar cell string 3, and thus it is not necessary to provide a separate power source for generating the inspection signal 51. The inspection apparatus 11 can therefore be made smaller and cheaper.

Fifth Embodiment

Another embodiment is as follows. To simplify the descriptions, elements having the same functions as the elements described in the above embodiment will be given the same reference numerals and not described. The inspection apparatus 11 according to an embodiment is configured to vary the frequency of the inspection signal 51 in accordance with the value of the serial resistance Rs.

The value of the serial resistance Rs of the solar cell module 2 (see FIG. 3) may become low as the solar cell module 2 deteriorates. If an attempt to detect a defect is made while the value of the serial resistance Rs is low, the difference between the serial resistance Rs in a normal solar cell module 2 and the serial resistance Rs in a defective solar cell module 2 will decrease. This makes it difficult to detect a defective solar cell module 2 when inspecting the solar cell string 3 for defects.

Accordingly, the inspection apparatus 11 varies the frequency of the inspection signal 51 in accordance with the value of the serial resistance Rs of the solar cell module 2, and reduces (brings closer to 0) the relative influence of the impedance of the solar cell string 3 on the impedance of the electrostatic capacitance Cg. The influence on the impedance of the serial resistance Rs increases as a result. Specifically, the frequency of the inspection signal 51 is increased as the resistance value of the serial resistance Rs decreases.

In this case, for example, a threshold may be set for the serial resistance Rs and the frequency of the inspection signal 51 may be switched in a plurality of stages using the threshold as a boundary. Meanwhile, in the inspection apparatus 11 illustrated in FIG. 1, the frequency of the inspection signal 51 is made variable by the inspection control unit 43 controlling the oscillation circuit 28. The value of the serial resistance Rs of the solar cell module 2 can be found through a known method, such as the method disclosed in JP 2013-527613A.

According to the configuration described above, the number and positions of defects in the solar cell module 2 can be detected accurately even if the value of the serial resistance Rs of the solar cell module 2 has decreased.

Sixth Embodiment

Another embodiment is as follows. To simplify the descriptions, elements having the same functions as the elements described in the above embodiment will be given the same reference numerals and not described.

In the first to fifth embodiments, the inspection apparatus 11 is configured to inspect the solar cell string 3 for defects while the solar cell string 3 is generating power. However, in an embodiment, the inspection apparatus 11 is configured to inspect for defects while the solar cell string 3 is not generating power.

An equivalent circuit of when the solar cell string 3 is not generating power is illustrated by the circuit diagram in FIG. 2. In this case, the junction capacitance Cd greatly affects the impedances Zp and Zn during the inspection signal positive terminal application and inspection signal negative terminal application. Accordingly, in an embodiment, a signal in a range of 1 kHz to 1 MHz, at a higher frequency than that used for detecting defects during power generation (1 MHz, for example), is used as the inspection signal 51 in order to reduce the impedance by the junction capacitance Cd.

Although the junction capacitance Cd differs depending on the type of the solar cell module 2, the junction capacitance Cd is almost the same in each solar cell module 2 of a solar cell string 3 that uses solar cell modules 2 of the same type. Meanwhile, in a state where the solar cell modules 2 are connected in series, the junction capacitance Cd in each solar cell module 2 is connected in series as well. As such, the impedance of the solar cell string 3 by the junction capacitance Cd increases as the number of solar cell modules 2 connected in series increases.

The inspection apparatus 11 inspects for defects by finding the ratio between the combined impedance Zpn and the reference impedance Z0, the ratio between the reference impedance Z0 and the impedance Zp or Zn, or the ratio Zn/(Zp+Zn):Zp/(Zp+Zn). This provides an advantage in that even if there is impedance by the junction capacitance Cd, that impedance has less influence on the inspection result.

According to the configuration described above, a higher frequency than that of the inspection signal in the first embodiment (1 MHz, for example) is selected for the inspection signal. The higher the frequency of the inspection signal is, the less the junction capacitance Cd will affect the impedances Zp and Zn. The impedance computation unit 46 can therefore accurately measure the impedances Zp and Zn, and thus the defect number determination unit 47 and the defect position identification unit 48 can appropriately find the number of defective locations and the positions of the defects, respectively.

Seventh Embodiment

Another embodiment is as follows. To simplify the descriptions, elements having the same functions as the elements described in the above embodiment will be given the same reference numerals and not described.

The first embodiment describes a configuration in which the defect inspection apparatus 32 finds the number of defective locations and the positions of the defects in the solar cell string 3. In an embodiment, the defect inspection apparatus 32 finds whether or not the solar cell string 3 is constructed correctly. In an embodiment, the solar cell string 3 not being constructed correctly includes, for example, a situation where a solar cell module 2 is not properly grounded.

If a given solar cell module 2 is not properly grounded, there will no longer be measurement current flowing back to the ground from that solar cell module 2 through the electrostatic capacitance Cg. The impedances Zp and Zn in a case where the solar cell module 2 is not properly grounded will be higher than the impedances Zp and Zn in the case where the solar cell string 3 is constructed correctly. For example, it is assumed that the solar cell string 3 includes 10 solar cell modules 2 connected in series. In this case, while impedances Zp and Zn of a correct solar cell string 3 are approximately 1600Ω, the impedances Zp and Zn of a solar cell string 3 including a solar cell module 2 improperly grounded will be approximately 1900Ω. The impedances Zp and Zn are almost the same values as long as the disconnects or defects have occurred in the solar cell string 3. Note that a disconnect in the solar cell string 3 includes a disconnect in the cable connecting solar cell modules 2 to each other and a cluster disconnect arising within a solar cell module 2. The defect in the solar cell string 3, meanwhile, includes a defect in a cell within a solar cell module 2.

In an embodiment, the inspection control unit 43 of the defect inspection apparatus 32 applies the inspection signal 51 to one of the P terminal and the N terminal of the solar cell string 3. The impedance computation unit 46 then finds the P terminal side impedance Zp or the N terminal side impedance Zn (index values) (an index value measurement step). Zp or Zn correspond to index values that vary depending on the number of solar cell modules 2 from the terminal where the inspection signal 51 is applied to the position where the construction is incorrect. The defect number determination unit 47 of an embodiment functions as a construction state determination unit.

The defect number determination unit 47 determines whether or not the solar cell string 3 is constructed correctly by making a comparison with the reference impedance Z0 (reference index value), which is an impedance in the case where the solar cell string 3 is constructed correctly (a construction state determination step). For example, if the impedance Zp or Zn deviates from the reference impedance Z0 by greater than or equal to a predetermined threshold, the defect number determination unit 47 determines that the solar cell string 3 is constructed incorrectly.

The present invention is not intended to be limited to the embodiments described above, and various changes can be made within the scope defined by the claims. Embodiments achieved by appropriately combining the technical means disclosed in different embodiments also fall within the technical scope of the present invention.

The invention claimed is:

1. An inspection apparatus for a photovoltaic power generation system comprising a solar cell string comprising a plurality of solar cell modules connected in series between a positive terminal and a negative terminal, the apparatus comprising:

an inspection signal application unit configured to sequentially carry out inspection signal positive terminal application of applying an AC inspection signal to the positive terminal and inspection signal negative terminal application of applying the inspection signal to the negative terminal;

an index value measurement unit configured to measure, during the inspection signal positive terminal application and during the inspection signal negative terminal application, index values that vary in accordance with: a number of the solar cell modules between the positive terminal where the inspection signal is applied and a position of a defect; and a number of the solar cell modules between the negative terminal where the inspection signal is applied and the position of the defect; and a plural defects detection unit configured to determine that there are at least two defects in the solar cell string in response to a third index value found from a first index value, measured by the index value measurement unit during the inspection signal positive terminal application, and a second index value, measured by the index value measurement unit during the inspection signal negative terminal application, deviating from a reference index value of a solar cell string having no defects by greater than or equal to a predetermined first threshold.

2. The inspection apparatus for a photovoltaic power generation system according to claim 1, further comprising:
a defect position identification unit configured to, in the case where the plural defects detection unit has determined that there are at least two defects in the solar cell string, identify a position of a first defect of the at least two defects that is closest to the positive terminal on the basis of a ratio of the reference index value to the first index value, and identify a position of a second defect of the at least two defects that is closest to the negative terminal on the basis of a ratio of the reference index value to the second index value.

3. The inspection apparatus for a photovoltaic power generation system according to claim 2,
wherein the first index value and the second index value are impedances of the solar cell string, and the third index value is a combined impedance found from the first index value and the second index value.

4. The inspection apparatus for a photovoltaic power generation system according to claim 1,
wherein the plural defects detection unit determines that there is one defect in the solar cell string in the case where the third index value deviates by greater than or equal to a second threshold set lower than the first threshold and by less than the first threshold.

5. The inspection apparatus for a photovoltaic power generation system according to claim 4, further comprising:
a defect position identification unit configured to identify the position of only one defect on the basis of a ratio between the first index value and the second index value.

6. The inspection apparatus for a photovoltaic power generation system according to claim 5,
wherein the first index value and the second index value are impedances of the solar cell string, and the third index value is a combined impedance found from the first index value and the second index value.

7. The inspection apparatus for a photovoltaic power generation system according to claim 4,
wherein the first index value and the second index value are impedances of the solar cell string, and the third index value is a combined impedance found from the first index value and the second index value.

8. The inspection apparatus for a photovoltaic power generation system according to claim 1,
wherein the first index value and the second index value are impedances of the solar cell string, and the third index value is a combined impedance found from the first index value and the second index value.

9. An inspection method for a photovoltaic power generation system, the method comprising:
sequentially applying an AC inspection signal to a positive terminal and a negative terminal of a solar cell string comprising a plurality of solar cell modules connected in series, and for each of the terminals, measuring index values that vary in accordance with: a number of the solar cell modules between the positive terminal where the inspection signal is applied and a position of a defect; and a number of the solar cell modules between the negative terminal where the inspection signal is applied and the position of the defect; and determining that there are at least two defects in the solar cell string in response to a third index value found from a first index value, corresponding to the index value obtained in the case where the inspection signal is applied to the positive terminal, and a second index value, corresponding to the index value obtained in the case where the inspection signal is applied to the negative terminal, deviating from a reference index value of a solar cell string having no defects by greater than or equal to a predetermined first threshold.

* * * * *